United States Patent
Langley (10) Patent No.: US 6,428,282 B1
(45) Date of Patent: *Aug. 6, 2002

(54) SYSTEM WITH FAN SPEED SYNCHRONIZATION CONTROL

(75) Inventor: Philip David Langley, Granite Bay, CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/332,519

(22) Filed: Jun. 14, 1999

(51) Int. Cl.$^7$ .............................................. F04B 41/06
(52) U.S. Cl. ................................. 417/2; 417/3; 417/42; 417/44.1
(58) Field of Search .......................... 417/3, 2, 32, 42, 417/44.11; 318/471, 439; 361/695

(56) References Cited

U.S. PATENT DOCUMENTS

| | | | |
|---|---|---|---|
| 4,095,425 A | * 6/1978 | Brown et al. .................. | 60/484 |
| 4,255,089 A | * 3/1981 | Phillips, Jr. et al. ............ | 417/2 |
| 4,756,473 A | 7/1988 | Takemae et al. | |
| 5,040,377 A | 8/1991 | Braun et al. | |
| 5,249,741 A | 10/1993 | Bistline et al. | |
| 5,287,244 A | 2/1994 | Hileman et al. | |
| 5,481,732 A | * 1/1996 | Shahbazi ..................... | 395/750 |
| 5,664,995 A | * 9/1997 | O'Keefe ...................... | 454/58 |
| 5,905,867 A | 5/1999 | Giorgio ....................... | 709/224 |
| 5,929,581 A | * 7/1999 | Van Brocklin et al. ..... | 318/471 |
| 5,990,582 A | * 11/1999 | Henderson et al. ......... | 307/139 |
| 6,045,331 A | * 4/2000 | Gehm et al. ................... | 417/2 |
| 6,054,823 A | * 4/2000 | Collings et al. ............ | 318/439 |

FOREIGN PATENT DOCUMENTS

| | | |
|---|---|---|
| GB | 2275351 | 8/1994 |
| JP | 06213545 | 8/1994 |

* cited by examiner

Primary Examiner—Cheryl J. Tyler (57) ABSTRACT

A system, such as a computer system, has cooling fans, each having a fan motor and fan blades. The fan motor operates to rotate the fan blades at a variable rotational speed. A frequency generator generates a reference speed signal having a reference frequency and a reference phase. Tachometers measure the variable rotational speeds of the fan blades of corresponding fans and provide corresponding fan speed signals representative of the variable rotational speeds of the corresponding fans. Each fan speed signal has a fan frequency and a fan phase. Motor controllers control the variable rotational speed of corresponding fan blades of corresponding fans based on the reference speed signal and the corresponding fan speed signals.

25 Claims, 4 Drawing Sheets

SYSTEM WITH FAN SPEED SYNCHRONIZATION CONTROL

THE FIELD OF THE INVENTION

The present invention generally relates to controlling a rotational speed of cooling fans in a system, and more particularly to synchronizing the rotational speeds of multiple cooling fans to one or more reference frequencies in a system, such as a computer system.

BACKGROUND OF THE INVENTION

Electronic systems, such as computer systems, include electronic components, such as microprocessors, memory, disk drives, integrated circuit chips, peripheral components, power supplies, and the like. The electronic components can generate excessive heat which needs to be dissipated from the electronic system. Therefore, such electronic systems typically include one or more cooling fans to remove heat generated within a housing of the system to reduce a temperature inside the housing.

Some conventional computer systems control the rotational speed of cooling fans based on ambient temperature of the external environment outside the housing of the computer system or internal temperature inside the housing. A typical speed controller reduces the rotational speed of the cooling fans when high rotational speed in not required to reduce audio noise. In addition, by operating the cooling fans at lower rotational speeds when high rotational speed is not required, power consumption is reduced and fan wear is reduced. When the external environment ambient temperature increases above normal room temperature, the internal temperature inside the computer system housing increases unless the cooling fans are operated at a faster rotational speed to further cool the inside of the housing. When the computer system is operated in a normal room temperature or cooler environment, the cooling fans can be operated at a reduced rotational speed.

Conventional computer systems with multiple cooling fans do not synchronize the multiple cooling fans to operate at the same rotational speed, which causes a variety of problems. For example, beat frequencies are created between fan air flows, fan motor assemblies, and/or chassis vibration from motor housing beats energizing the chassis resonance frequencies. These beat frequencies result in an increased amount of acoustical noise being produced by the computer system. In addition, cooling fans which are not speed synchronized do not perform the same amount of work in moving air causing some fans to be overburdened while other fans are underburdened. Furthermore, the variation in the fan rotational speeds can result in uneven air flow which creates weak or dead spots in the input air plenum. Variation in fan rotational speeds can widen as computer systems age, because as a cooling fan ages and wears, a bearing friction in a motor of the cooling fan tends to increase which leads to reduced rotational speeds of the fan.

For reasons stated above and for other reasons presented in greater detail in the Description of the Preferred Embodiments section of the present specification, an electronic system, such as a computer system, is desired which synchronizes the rotational speeds of cooling fans employed by the system.

SUMMARY OF THE INVENTION

The present invention provides a system having a housing and N fans. Each fan has a fan motor and fan blades. The fan motor operates to rotate the fan blades at a variable rotational speed to reduce a temperature inside of the housing. A frequency generator generates a reference speed signal having a reference frequency and a reference phase. The system also includes N tachometers and N motor controllers. Each tachometer measures the variable rotational speed of the fan blades of a corresponding one of the N fans and provides a fan speed signal representative of the variable rotational speed. The fan speed signal has a fan frequency and a fan phase. Each motor controller controls the variable rotational speed of the fan blades of a corresponding one of the N fans based on the reference speed signal and the fan speed signal.

In one embodiment of the system, a phase detection circuit measures a difference between the reference phase and the fan phase to provide a phase difference signal. An instantaneous velocity difference circuit measures an instantaneous difference between the reference frequency and the fan frequency to provide an instantaneous velocity difference signal. An integral velocity difference circuit measures an integral difference between the reference frequency and the fan frequency to provide an integral velocity difference signal. An adder adds the phase difference signal, the instantaneous velocity difference signal, and the integral velocity difference signal to provide a voltage control signal for controlling the variable rotational speed of the fan blades of the corresponding fan.

In one embodiment of the system, a pulse width modulation (PWM) controller controls power supplied to the corresponding fan motor based on the voltage control signal. A lock detector detects whether the PLL controller is in lock. The lock detector provides an indication of a fan failure when the lock detector fails to detect a lock condition for a selected time interval.

In one embodiment, the instantaneous velocity difference circuit includes a first pulse generator responsive to the reference speed signal for generating reference speed pulses having a first state for a first time width T1. A first filter filters the reference speed pulses to generate a reference speed voltage representative of a duty cycle of the reference speed pulses. A second pulse generator responds to the fan speed signal for generating fan speed pulses having a second state opposite to the first state for the first time width T1. A second filter filters the fan speed pulses to generate a fan speed voltage representative of a duty cycle of the fan speed pulses. An adder sums the reference speed voltage and the fan speed voltage to provide a summed voltage representative of the instantaneous difference between the reference frequency and the fan frequency.

In one embodiment, the integral velocity difference circuit receives a reference clock signal and includes and an up/down counter and a digital-to-analog converter (DAC). The up/down counter provides an updated digital count value in response to each active transition of the reference clock signal. If the reference speed signal and the fan speed signal have the same logic state for that active clock transition, the count value is maintained at its current state. If the reference speed signal is at an active logic state and the fan speed signal is at an inactive logic state for that active clock transition, the count value is incremented by one binary value. If the fan speed signal is at an active logic state and the reference speed signal is at an inactive logic state for that active clock transition, the count value is decremented by one binary value. The DAC converts the digital count value from the up/down counter to an analog voltage level representative of the integral difference between the reference frequency and the fan frequency.

In one embodiment, the least significant bit of the digital count value represents phase difference information indicative of a difference between the reference phase and the fan phase. A filter filters the least significant bit of the digital count value to generate an analog voltage representative of a duty cycle of active states of the least significant bit of the digital count value.

A system, such as a computer system, according to the present invention synchronizes the rotational speeds of cooling fans employed by the system, which substantially eliminates possible beat frequencies between fan air flows, fan motor assemblies, and/or chassis vibration from motor housing beats energizing the chassis resonance frequencies to reduce acoustical noise produced by the system. Synchronizing the cooling fans to the same rotational speed, assures that all cooling fans perform substantially the same amount of work in moving air inside housing of the system and assures that air flow throughout the housing is even. Since the cooling fans are locked to the reference speed signal, age and wear of the fans does not alter fan rotational speed until a given fan is unable to maintain speed at full voltage. Furthermore, the fan synchronization speed control of the present invention adds only a small incremental cost to the conventional speed control methods.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
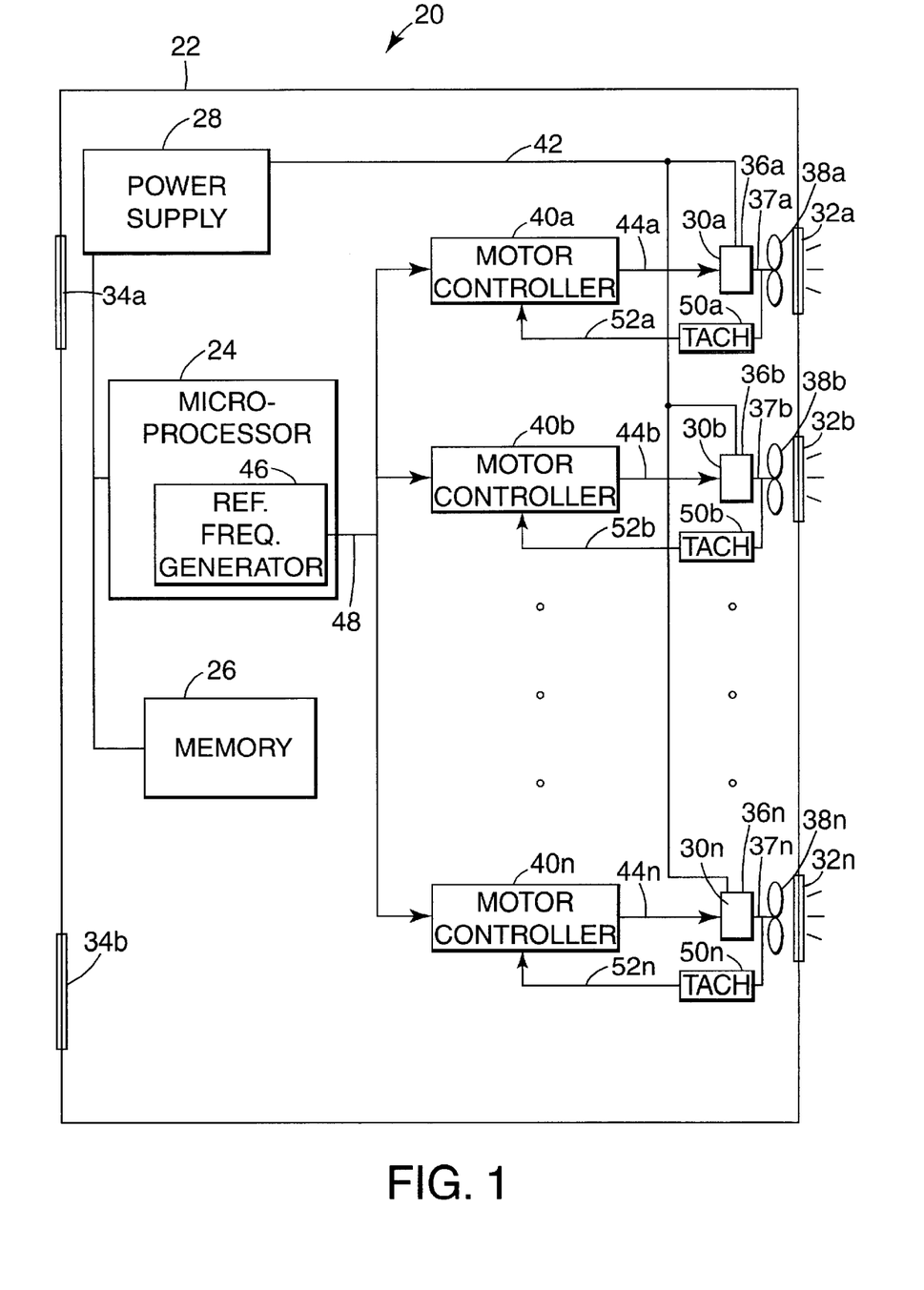
FIG. 1 is a block diagram of one embodiment of a computer system according to the present invention including cooling fans which are controlled to synchronize the rotational speeds of the cooling fans to one reference speed signal.

One embodiment of a computer system according to the present invention is illustrated generally at 20 in FIG. 1 in block diagram form. The present invention is described in detail herein with reference to computer systems, but can apply equally to other electrical or electronic systems which include electrical or electronic components which generate excessive heat which needs to be dissipated by cooling fans. Computer system 20 includes a housing 22 which surrounds electronic components and other internal components of computer system 20. Computer system 20 includes a microprocessor 24 for performing sequences of logical operations and a memory 26 for storing instructions and data for use by microprocessor 24. Memory 26 typically includes random access memory (RAM), non-volatile memory, and a hard disk drive, but can include any known type of memory storage. A power supply 28 supplies regulated voltage power to devices in computer system 20, such as microprocessor 24 and memory 26.

When power supply 28 supplies power to electronic components of computer system 20, such as microprocessor 24, memory 26, and other integrated circuit (IC) components and discrete logic components, the powered electronic components generate heat proportional to the square of the current drawn by the electronic components. The excessive heat generated by the electronic components can result in heat related breakdown of components in the computer system and other heat related problems, such as components not operating according to specifications. Therefore, computer system 20 includes N cooling or exhaust fans, such as indicated at 30a, 30b, and 30n. Cooling fans 30a–30n are mounted in housing 22 approximate to N corresponding exhaust vents, such as indicated at 32a, 32b, and 32n. Computer system 20 also includes inlet vents, such as indicated at 34a and 34b. Cooling fans 30a–30n draw external air from the environment outside of housing 22 through inlet vents 34a and 34b and exhausts internal air from the inside of housing 22 through exhaust vents 32a–32n. By operating cooling fans 30a–30n in this manner, an internal temperature in housing 22 is reduced, which permits higher power electronic components to be utilized in computer system 20.

Each cooling exhaust fan 30 includes a motor 36, a motor shaft 37, and fan blades 38. Each fan motor 36a–36n operates to rotate corresponding motor shafts 37a–37n, which is mechanically coupled to corresponding fan blades 38a–38n to cause fan blades 38 to rotate at a variable rotational speed or spin-rate to reduce the temperature inside of housing 22. Power is supplied to fan motors 36 from power supply 28 via power lines 42. In one embodiment, power lines 42 supply +48 volts of regulated power to fan motors 36.

N corresponding motor controllers 40, such as indicated at 40a, 40b, and 40n, control the regulated voltage power from power supply 28 that is supplied to motors 36 on power lines 42 via corresponding control lines 44a–44n, which are coupled to fan motors 36a–36n respectively. In this manner, motor controllers 40a–40n control the variable rotational speed of corresponding fans blades 38a–38n of the corresponding cooling fans 30a–30n.

In one mode of operation, one function of microprocessor 24 is as a frequency generator 46 to generate a reference speed signal, which is provided on line 48 to motor controllers 40a–40n. The reference speed signal on line 48 indicates a required or desired speed for fan blades 38 of cooling fans 30, based on an algorithm performed in microprocessor 24. One example algorithm employs the internal temperature inside housing 22 and/or the ambient temperature of the external environment outside of housing 22. The reference speed signal from frequency generator 46 of microprocessor 24 provided on line 48 has a reference frequency and a reference phase. In one example embodiment, the desired reference frequency is approximately 100 Hz.

Computer system 20 includes N tachometers, such as indicated at 50a, 50b, and 50n. The tachometers 50 measure the variable rotational speed of the fan blades 38 of the N fans 30 in a known manner by measuring the rotational speed of motor shaft 37 which drives fan blades 38. Tachometers 50a–50n provide corresponding fans speed signals representative of the variable rotational speed of the corresponding N fans 30 on lines 52a–52n to motor controllers 40a–40n respectively. Each fan speed signal from tachometers 50a–50n have a fan frequency and a fan phase representative of the variable rotational speed of the corresponding fan blades 38.

In one preferred embodiment described below, each motor controller 40 is the control portion of a phase-locked loop (PLL) channel optimized for a motor control loop. As described in detail below, each motor controller 40 keeps its corresponding PLL fan 30 in lock to a rotational speed indicated by the reference speed signal provided on line 48. Each corresponding PLL channel 100 used to control each corresponding fan motor 36 controls the variable rotational speed of fan blades 38 of a corresponding fan 30 by controlling the amount of power supplied to motors 36 on power lines 42 from power supply 28 based on: the reference frequency and the reference phase of the reference speed signal on line 48; and the fan frequency and the fan phase of the fan speed signal provided on lines 52 (i.e., the difference between the reference frequency and the fan frequency and/or the difference between the reference phase and the fan phase).

Figure 2:
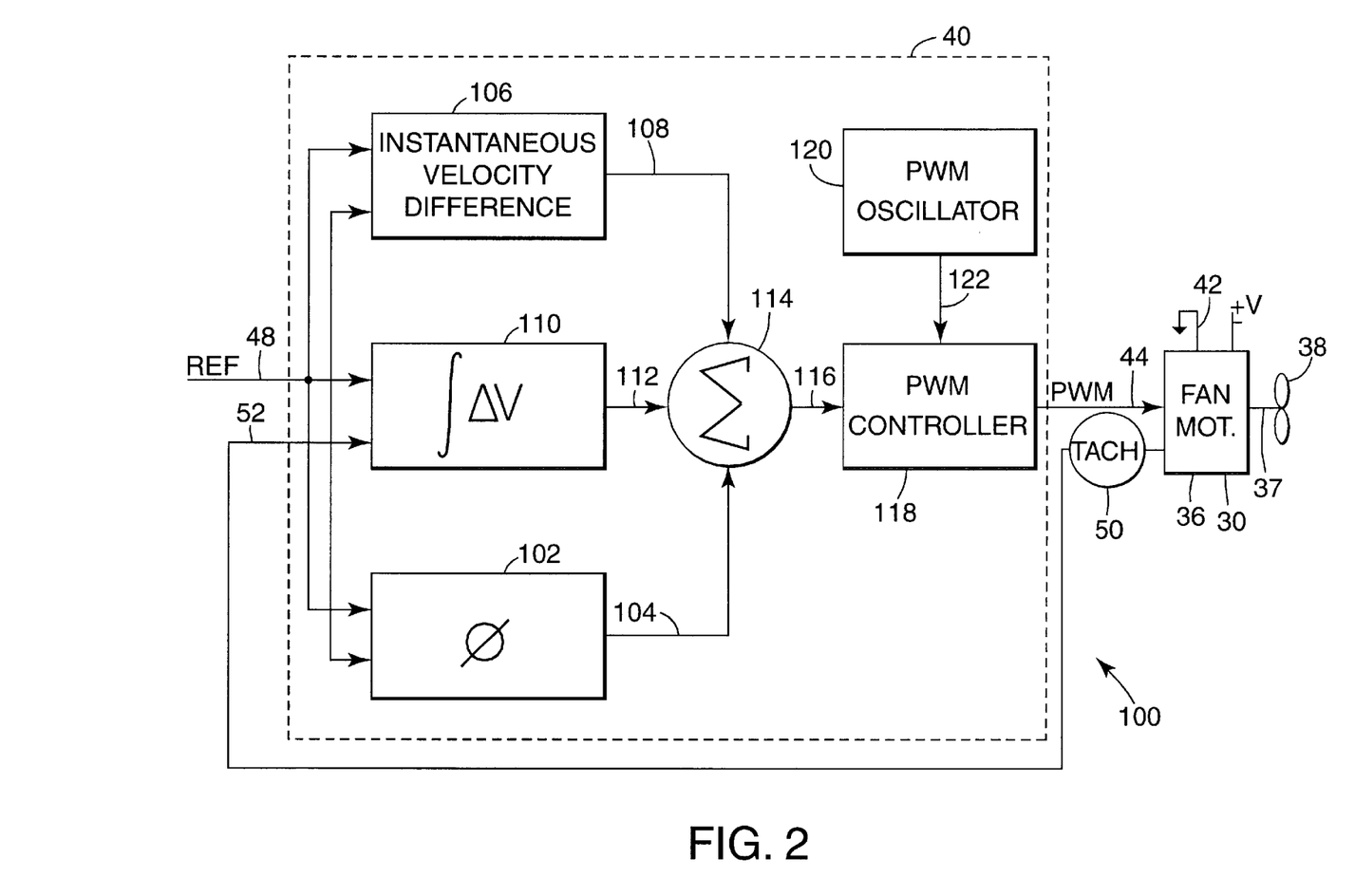
FIG. 2 is one embodiment of a phase-locked loop (PLL) channel according to the present invention for synchronizing cooling fan rotational speeds in the computer system of FIG. 1 or other electronic system having multiple cooling fans.

FIG. 2 is a block diagram of one embodiment of a PLL channel 100 according to the present invention which is suitable for synchronizing the rotational speeds of fan blades 38 of fans 30 of computer system 20 so that all of the N fans 30 run at substantially the same rotational speed. Each PLL channel 100 includes fan 30, tachometer 50, frequency generator 46 of microprocessor 24, and motor controller 40 coupled as described above with reference to FIG. 1. Fan motor 36 of fan 30 essentially functions as the voltage controlled oscillator (VCO) of a classical PLL. Fan motor 36, however, is an electromechanical motor having inertia, and the VCO of a classical PLL does not have inertia. Therefore, special PLL design techniques must be employed according to the present invention to guarantee loop stability in PLL channel 100. Motor controller 40 is illustrated in more detail in FIG. 2 and is implemented essentially as a digital phase-locked loop (DPLL). Motor controller 40 includes digital phase detectors and digital frequency detectors, but also includes analog circuitry after the digital detection circuitry to provide analog fan motor control.

As illustrated in FIG. 2, motor controller 40 includes a phase detection circuit 102 for measuring a difference between the reference phase of the reference speed signal on line 48 and the fan phase of the fan speed signal on line 52 to provide a phase difference signal on a line 104. An instantaneous velocity difference circuit 106 measures an instantaneous difference between the reference frequency of the reference speed signal on line 48 and the fan frequency of the fan speed signal on line 52 to provide an instantaneous velocity difference signal on a line 108. An integral velocity difference circuit 110 measures an integral difference between the reference frequency of the reference speed signal on line 48 and the fan frequency of the fan speed signal on line 52 to provide an integral velocity difference signal on a line 112.

An adder 114 receives the phase difference signal on line 104, the instantaneous velocity difference signal on line 108, and the integral velocity difference signal on line 112, and adds these signals to provide a voltage control signal on a line 116. The voltage control signal on line 116 represents the summation of the magnitude values of the phase difference signal on line 104, the instantaneous velocity difference signal on line 108, and the integral velocity difference signal on line 112.

A pulse width modulation (PWM) controller 118 receives and is controlled by the voltage control signal on line 116. A PWM oscillator 120 provides a PWM clock signal having a fixed frequency to PWM controller 118 on a line 122. PWM controller operates in a known manner to control the amount of power supplied to fan motor 36 of fan 30 from power lines 42 via a PWM control signal provided on line 44. PWM controller 118 operates at the fixed frequency clock rate of the PWM clock signal provided on line 122, which in one embodiment of the present invention is approximately 2.2 KHz. In addition, the voltage control signal provided on line 116 further controls the operation of PWM controller 118 to control the amount of power supplied to fan motor 36 from power lines 42 to thereby control the variable rotational speed of fan blades 38 of fan 30. In one embodiment, the power provided to fan motor 36 has a regulated voltage of approximately +48 volts.

In operation, motor controller 40 operates in the following manner to lock the rotational speed of motor shaft 37 and thereby the rotational speed of fan blades 38 to the rotational speed indicated by the reference speed signal on line 48. When PLL channel 100 is in lock, the instantaneous velocity difference signal on line 108 and the integral velocity difference signal on line 112 are zero, because the fan frequency of the fan speed signal on line 52 is locked to the reference frequency of the reference speed signal on line 48. Thus, when PLL channel 100 is in lock, the phase difference signal provided from phase detection circuit 102 is essentially provided as the voltage control signal on line 116 to PWM controller 118 to increase or decrease the rotational speed of fan motor 36 to maintain the fan phase of the fan speed signal on line 52 at the reference phase of the reference speed signal on line 48.

The instantaneous velocity difference circuit 106 and the integral velocity difference circuit 110, however, operate to capture or lock PLL channel 100 into a lock range faster and to ensure stability. When attempting to lock PLL channel 100, phase detection circuit 102 does not yield sufficient control as would normally be the case in a classical PLL system, because fan motor 36 has too much inertia. Phase detection circuit 102 alone could not produce sufficient control to sufficiently change the output of PLL channel 100. In a classical PLL system, the VCO does not have such inertia as fan motor 36 of PLL channel 100.

Instantaneous velocity difference circuit 106 quickly responds to differences between the fan frequency of the fan speed signal on line 52 and the reference frequency of the reference speed signal on line 48. The integral velocity difference circuit 110 provides a slower moving response to differences between the fan frequency and the reference frequency. The slower moving response of integral velocity difference circuit 110 provides more precise control by adding a history component to the measuring of the differences between the fan frequency and the reference frequency, which yields a longer time constant in PLL channel 100. For example, if fan bearings of fan motor 36 are aged, and therefore, have a higher frictional force, more power is needed from power supply 28 to maintain the desired rotational speed of fan blades 38. The integral velocity difference signal on line 112 provides offset for the fan motor bearing friction, such that as the instantaneous velocity difference signal on line 108 approaches zero, the integral velocity difference signal on line 112 maintains sufficient voltage to PWM controller 118 to offset the fan motor bearing friction. In essence, the instantaneous velocity difference circuit 106 provides for faster locking to the reference speed signal on line 48, but the history component provided by the integral velocity difference circuit 110 maintains the proper error voltage on voltage control signal 116 to prevent PLL channel 100 from oscillating.

Figure 3:
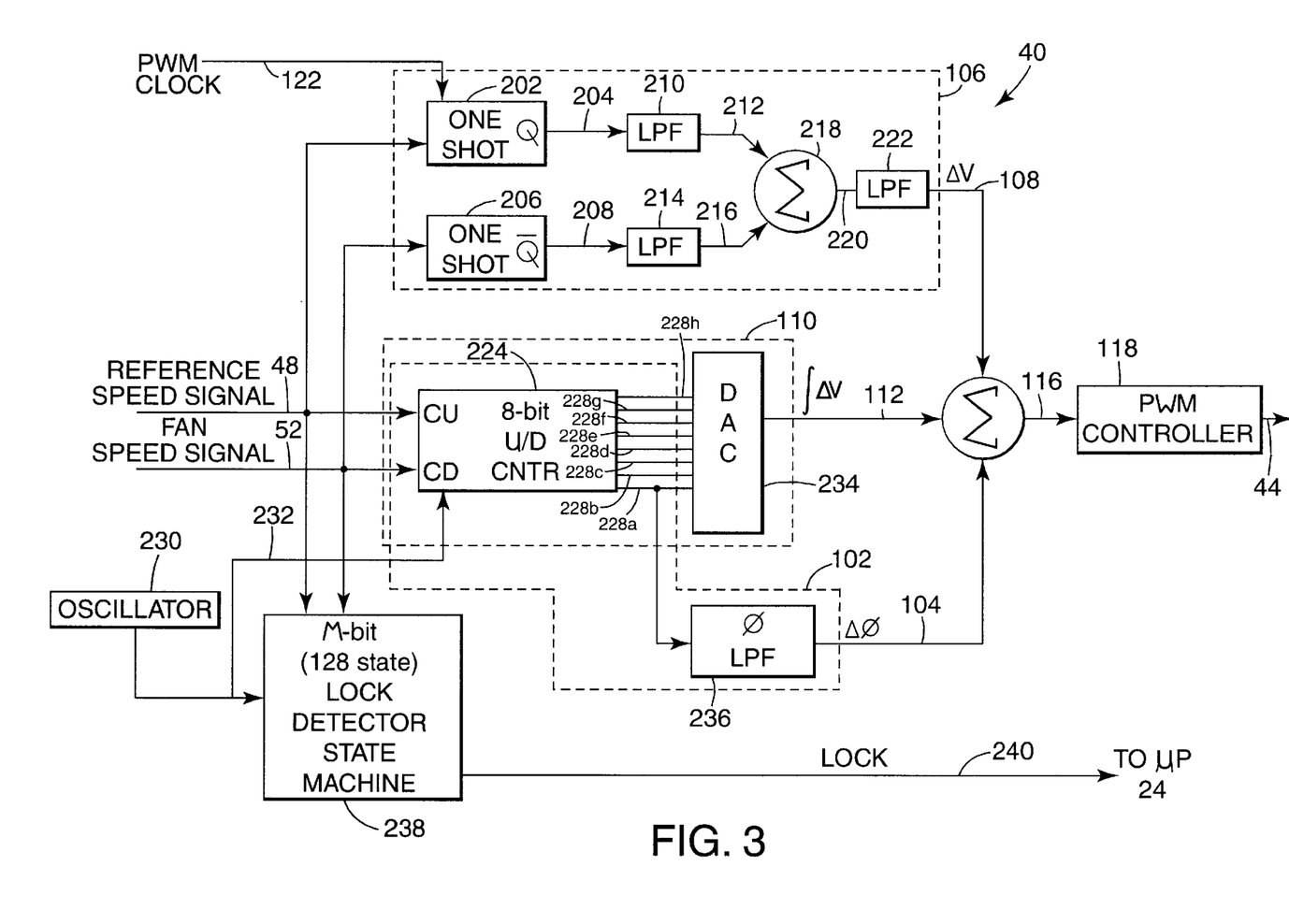
FIG. 3 is a block diagram of one embodiment of a motor controller according to the present invention for the PLL channel of FIG. 2.

One embodiment of motor controller 40 is illustrated in more detail in block diagram form in FIG. 3. Instantaneous velocity difference circuit 106 includes a digital one-shot pulse generator 202 which receives the reference speed signal on line 48 and the PWM clock signal on line 122 to generate reference speed pulses on a line 204. Each difference speed pulse has an active high logic state for a time width $T_1$. Time width $T_1$ represents a count of a number of the PWM clock pulses, which in one example embodiment are pulsed at 2.2 KHz. A digital one-shot pulse generator 206 receives the fan speed signal on line 52 and the PWM clock signal on line 122 and generates fan speed pulses on a line 208. Each fan speed pulse has an active low logic state (i.e., opposite logic state to the high logic state provided by the active pulses of digital one-shot pulse generator 202) for the time width $T_1$.

A low-pass filter 210 generates a reference speed voltage on a line 212 representative of the duty cycle of the reference speed pulses provided on line 204. Similarly, a low-pass filter 214 generates a fan speed voltage on a line 216 representative of the duty cycle of the fan speed pulses provided on line 208. An adder 218 sums the reference speed voltage on line 212 and the fan speed voltage on line 216 to provide a summed voltage on a line 220 representative of the instantaneous difference between the reference frequency and the fan frequency. A low-pass filter 222 further filters the summed voltage on line 220 to provide the instantaneous velocity difference signal on line 108 representative of the difference between the reference frequency and the fan frequency.

Digital one-shot pulse generator 202 and the down line low-pass filter 210 operate together to perform a frequency-to-voltage conversion on the reference speed signal on line 48 to produce a reference voltage on line 212 that varies according to the reference frequency of the reference speed signal on line 48. Similarly, digital one-shot pulse generator 206 and the down line low-pass filter 214 operate together to provide frequency-to-voltage conversion on the fan speed signal on line 52 to provide the fan speed voltage on line 216 that varies according to the fan frequency of the fan speed signal on line 52. Since the reference speed voltage provided on line 212 is based on active high input pulses and the fan speed voltage provided on line 216 is based on active low pulses, the summation of the voltages on lines 212 and 216 provides a difference voltage on line 220. For example, if the duty cycle of the reference speed pulses on line 204 is the same as the duty cycle of the fan speed pulses on line 208, the voltage value on line 220 is approximately zero. Since the voltage difference value on line 220 is possibly changing with each new reference speed signal and fan speed signal sampling, low-pass filter 222 provides the necessary filtering to provide an instantaneous velocity difference signal on line 108 representative of the instantaneous difference between the reference frequency and the fan frequency.

Integral velocity difference circuit 110 includes an up/down (U/D) counter 224, which receives the reference speed signal on line 48 at a count up (CU) input and the fan speed signal on line 52 at a countdown (CD) input to provide an 8-bit (i.e., up to 256 binary values) count on output count lines 228a–228h, where 228a is the least significant bit of the output count and line 228h is the most significant bit of the output count. The eight bits provided by up/down counter 224 represent one example of any suitable N bit count representing 2N binary values. An oscillator 230 provides a reference clock signal on a line 232 to up/down counter 224.

With each active transition of the reference clock on line 232, up/down counter 224 increments by one binary value, decrements by one binary value, or does not change the count value provided on lines 228 depending on the logic states of the reference speed signal on line 48 and the fan speed signal on line 52. If the reference speed signal on line 48 and the fan speed signal on line 52 are both logic high values or both logic low values, the count value on lines 228 remains unchanged for that active clock transition. If the reference speed signal on line 48 is a logic high value and the fan speed signal on line 52 is a logic low value, the count value on lines 228 is incremented up by one binary value for that active clock transition. If the fan speed signal on line 52 is a logic high value and the reference speed signal on line 48 is a logic low value, the output count on lines 228 is decremented by one binary value for that active clock transistor.

When up/down counter 224 reaches its maximum value (e.g., 255 for the example 8-bit counter 224), and the reference speed signal on line 48 is at a logic high value and the fan speed signal on line 52 is at a logic low value, the output count value from up/down counter 224 remains at the maximum 255 value. Similarly, when the up/down counter 224 reaches its minimum value of zero, and the fan speed signal on line 52 is at a logic high value and the reference speed signal on line 48 is at a logic low value, the output count value from up/down counter 224 remains at the minimum zero value.

A digital-to-analog converter (DAC) 234 receives the digital binary count represented on lines 228 and converts this digital value to an analog voltage level, which is provided on line 112 and is representative of the integral difference between the reference frequency and the fan frequency.

In the embodiment of motor controller 40 illustrated in FIG. 3, a portion of the function of phase detector circuit 102 is performed by up/down counter 224. Up/down counter 224 provides the output count on lines 228, and the least significant bit of the output count on line 228a represents phase difference information. Specifically, the duty cycle of the logic high pulses of the least significant bit of the output count provides phase information indicative of the difference between the reference phase of the reference speed signal on line 48 and the fan phase of the fan speed signal on line 52. A phase low-pass filter 236 converts the logic high pulse duty cycle into an analog voltage level provided on line 104, which represents the instantaneous phase difference between the reference phase and the fan phase. Thus, as indicated in FIG. 3, the function of phase detector circuit 102 is performed by up/down counter 224 and phase low-pass filter 236.

The embodiment of motor controller 40 illustrated in FIG. 3 also includes a lock detector state machine 238. Lock detector state machine 238 is implemented as a M bit state machine having $2^M$ possible states. In one example embodiment, lock detector state machine 238 is a 7-bit state machine having 128 possible states. Lock detector state machine 238 receives the reference speed signal on line 48 and the fan speed signal on line 52 and is clocked by the reference clock signal on line 232 to provide a fan lock signal on line 240, which is active when the fan speed signal on line 52 is locked to the reference speed signal on line 48. If the fan lock signal on line 240 is not activated for a predetermined time interval $T_2$, this indicates that the fan 30 of the corresponding PLL channel 100 has failed. The fan lock signal on line 240 is provided to microprocessor 24, which can processes the fan lock signal and indicates a fan failure when the lock detector state machine 238 fails to detect a lock condition for the selected time interval $T_2$. In one example embodiment of the present invention, the selected time interval $T_2$ is approximately 15 seconds. The time interval $T_2$ is fan dependent, and is based on fan response time to the PLL control and other such design criteria.

In the above-described embodiment of computer system 20, the N cooling exhaust fans 30 are all configured to run at substantially the same rotational speed by being synchronized to one reference speed signal having one reference frequency and one reference phase via N separate corresponding PLL channels 100. Synchronizing the rotational speed of the N fans 30 substantially eliminates possible beat frequencies between fan air flows, fan motor assemblies, and/or chassis vibration from motor housing beats energizing the chassis resonance frequencies. The substantial elimination of these beat frequencies through synchronizing the rotational speeds of fans 30 reduces acoustical noise produced by computer system 20.

In addition, synchronizing all of fans 30 to the same rotational speed, assures that all fans 30 perform substantially the same amount of work in moving air inside housing 22 of computer system 20 so that no fans are overburdened with extra load while other fans are underburdened. In addition, synchronizing the rotational speeds of fans 30 assures that air flow throughout housing 22 is even so that there are not weak or dead spots in the input air plenum.

Furthermore, synchronizing all fans 30 to the same reference speed signal assures that all fans 30 continue to rotate at the same rotational speed regardless of age or wear. As fans 30 age, frictional forces in their bearings tend to increase causing reduced fan rotational speeds if power supplied to the fans is not increased. Nevertheless, since fans 30 are locked to the reference speed signal on line 48, age and wear of fans 30 does not alter fan rotational speed until a given fan 30 is unable to maintain speed at full voltage.

Moreover, having a separate PLL channel 100 control each fan 30 provides a convenient method to determine fan 30 failure. If the PLL channel 100 can not maintain lock, the fan lock signal on line 240 is not activated for the selected time interval $T_2$ and the corresponding fan 30 is indicated as a failed fan. If the PLL channel 100 maintains lock, then the fan lock signal on line 240 remains activated and that fan 30 is indicated to be operating properly and necessarily is operating at the rotational speed indicated by the reference speed signal on line 48.

In addition, as mentioned in the Background of the Invention section of this present specification, conventional systems use speed control to reduce the rotational speed of the cooling fan, when such a speed is not required to reduce audio noise, reduce power consumption, and reduce fan wear. The fan synchronization speed control of the present invention adds only a small incremental cost to this conventional speed control to provide the above-benefits over conventional speed control methods.

The above-described embodiments of the present invention employ one reference speed signal on line 48 to synchronize all N cooling fans 30 to the same reference frequency and reference phase. However, in alternative embodiments of the present invention, there are multiple reference speed signals which synchronize cooling exhaust fans to more than one reference speed signal.

Figure 4A:
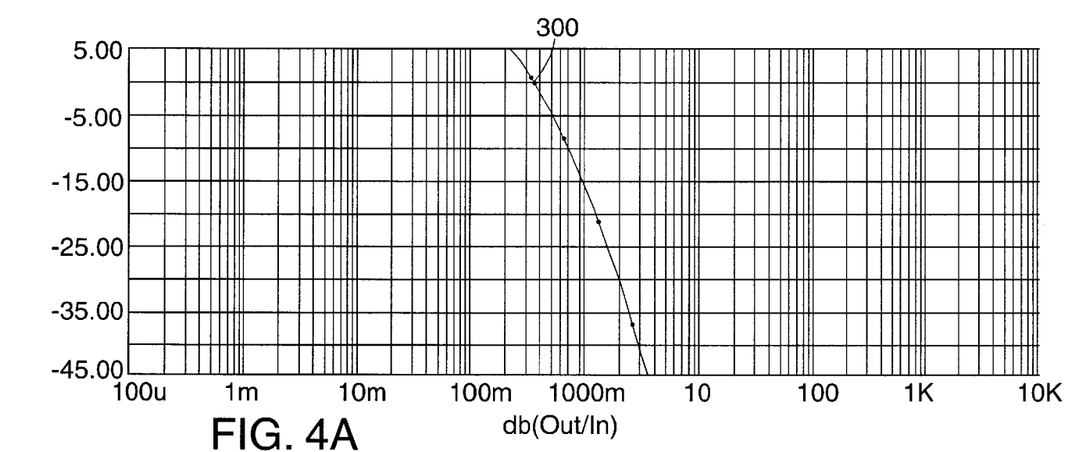
FIG. 4A is a graph plotting the gain of an example PLL channel according to FIGS. 2 and 3 versus various reference speed frequencies.
Figure 4B:
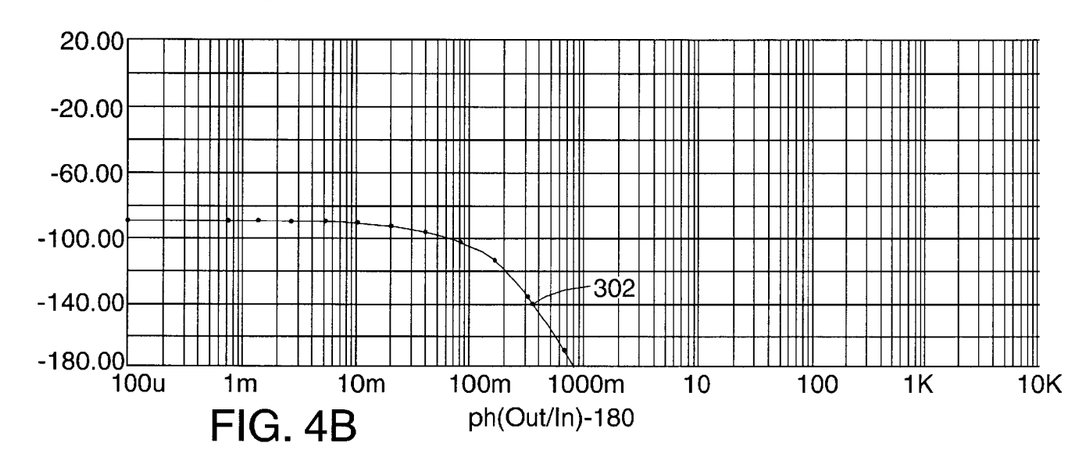
FIG. 4B is a graph plotting phase shift of the example PLL channel according to FIGS. 2 and 3 versus various reference speed frequencies.

PLL channel 100 is a feedback control system where negative feedback is acceptable, but positive feedback situations can cause oscillation in the feedback control system. FIGS. 4A and 4B represent phase margin plots of an example PLL channel 100 according to the embodiment illustrated in FIGS. 2 and 3 above. The exemplary computer system 20 of FIG. 1 was modeled and simulated according to the plots of FIGS. 4A and 4B, while operating in an ambient air temperature of approximately 27° C. FIG. 4A specifically plots the amplitude gain of the output of PLL channel 100 over the input of PLL channel 100 for various frequencies of the fan speed signal on line 52. FIG. 4B specifically plots the phase shift represented by the output of PLL channel 100 over the input of PLL channel 100 minus 180° for various frequencies for the fan speed signal on line 52. As in any such feedback control system, the phase shift is required to be less than 180°, when the feedback amplitude or gain is zero or higher (i.e., positive gain). Unity gain is achieved at approximately 300 millihertz, as indicated at 300 in FIG. 4A. The phase shift plotted in FIG. 4B at approximately 300 millihertz, is approximately −140°, as indicated at 302. Therefore, the phase plots of FIGS. 4A and 4B indicate that the modeled computer system 20 has a PLL phase margin of approximately 40° (i.e., 180°−140°). The 40° phase margin guarantees that the PLL loop is stable for the PLL channel 100 modeled and simulated according to the plots of FIGS. 4A and 4B.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A system comprising:
    a housing;
    N fans, each fan having a fan motor and fan blades, wherein the fan motor operates to rotate the fan blades at a variable rotational speed to reduce a temperature inside of the housing;
    at least one frequency generator for generating at least one reference speed signal having a reference frequency and a reference phase;
    N tachometers, each tachometer measuring the variable rotational speed of the fan blades of a corresponding one of the N fans and providing a fan speed signal representative of the variable rotational speed, wherein the fan speed signal has a fan frequency and a fan phase; and
    N motor controllers, each motor controller controlling the variable rotational speed of the fan blades of a corresponding one of the N fans based on one of the at least one reference speed signal and the fan speed signal.

2. The system of claim 1 wherein each motor controller includes:
  means for measuring a difference between the reference phase and the fan phase.

3. The system of claim 1 wherein each motor controller includes:
  means for measuring an instantaneous difference between the reference frequency and the fan frequency.

4. The system of claim 3 wherein the means for measuring the instantaneous difference includes:
  a first pulse generator responsive to the one reference speed signal for generating reference speed pulses having a first state for a first time width T1;
  a first filter for filtering the reference speed pulses to generate a reference speed voltage representative of a duty cycle of the reference speed pulses;
  a second pulse generator responsive to the fan speed signal for generating fan speed pulses having a second state opposite to the first state for the first time width T1;
  a second filter for filtering the fan speed pulses to generate a fan speed voltage representative of a duty cycle of the fan speed pulses; and
  an adder for summing the reference speed voltage and the fan speed voltage to provide a summed voltage representative of the instantaneous difference between the reference frequency and the fan frequency.

5. The system of claim 1 wherein each motor controller includes:
  means for measuring an integral difference between the reference frequency and the fan frequency.

6. The system of claim 5 wherein the means for measuring the integral difference receives a reference clock signal and includes:
  an up/down counter providing an updated digital count value in response to each active transition of the reference clock signal as follows:
    maintaining the count value at its current state if the reference speed signal and the fan speed signal have the same logic state for that active clock transition;
    incrementing the count value by one binary value if the reference speed signal is at an active logic state and the fan speed signal is at an inactive logic state for the active clock transition; and
    decrementing the count value by one binary value if the fan speed signal is at an active logic state and the reference speed signal is at an inactive logic state for that active clock transistor; and
  a digital-to-analog converter for converting the digital count value from the up/down counter to an analog voltage level representative of the integral difference between the reference frequency and the fan frequency.

7. The system of claim 6 wherein the least significant bit of the digital count value represents phase difference information indicative of a difference between the reference phase and the fan phase, and the motor controller further includes:
  a filter for filtering the least significant bit of the digital count value to generate an analog voltage representative of a duty cycle of active states of the least significant bit of the digital count value.

8. The system of claim 1 wherein each motor controller includes:
  a pulse width modulation (PWM) controller for controlling power supplied to the corresponding fan motor.

9. The system of claim 1 wherein each motor controller includes:
  means for measuring a difference between the reference phase and the fan phase to provide a phase difference signal;
  means for measuring an instantaneous difference between the reference frequency and the fan frequency to provide an instantaneous velocity difference signal;
  means for measuring an integral difference between the reference frequency and the fan frequency to provide an integral velocity difference signal; and
  means for adding the phase difference signal, the instantaneous velocity difference signal, and the integral velocity difference signal to provide a voltage control signal for controlling the variable rotational speed of the fan blades of the corresponding fan.

10. The system of claim 9 wherein each motor controller includes:
  a pulse width modulation (PWM) controller for controlling power supplied to the corresponding fan motor based on the voltage control signal.

11. The system of claim 1 wherein the each motor controller includes:
  a phase locked loop (PLL) controller; and
  means for detecting whether the PLL controller is in lock.

12. The system of claim 11 wherein the means for detecting provides an indication of a fan failure when the means for detecting fails to detect a lock condition for a selected time interval.

13. The system of claim 1 wherein the system is a computer system.

14. A method of cooling a system having a housing and N fans, each fan having a fan motor and fan blades, comprising the steps of:
  operating each fan motor to rotate the corresponding fan blades at a variable rotational speed to reduce a temperature inside of the housing;
  generating at least one reference speed signal having a reference frequency and a reference phase;
  measuring the variable rotational speeds of the fan blades of each of the N fans and providing N fan speed signals representative of the variable rotational speeds, wherein the N fan speed signals each have a fan frequency and a fan phase; and
  controlling the variable rotational speeds of the fan blades of each of the N fans based on the at least one reference speed signal and the N corresponding fan speed signals.

15. The method of claim 14 wherein the controlling step includes the step of:
  measuring a difference between the reference phase and each corresponding fan phase.

16. The method of claim 14 wherein the controlling step includes the step of:
  measuring an instantaneous difference between the reference frequency and each corresponding fan frequency.

17. The method of claim 16 wherein the measuring step includes the steps of:
  generating reference speed pulses having a first state for a first time width T1 in response to the at least one reference speed signal;
  filtering the reference speed pulses to generate a reference speed voltage representative of a duty cycle of the reference speed pulses;
  generating fan speed pulses having a second state opposite to the first state for the first time width T1 in response to each fan speed signal;

filtering the fan speed pulses to generate N fan speed voltages representative of a duty cycle of the fan speed pulses; and summing the reference speed voltage and each fan speed voltage to provide N summed voltages representative of the instantaneous difference between the reference frequency and each corresponding fan frequency.

18. The method of claim 14 wherein the controlling step includes the step of:

measuring an integral difference between the reference frequency and each corresponding fan frequency.

19. The method of claim 18 wherein the measuring step includes the steps of:

providing a reference clock signal;

providing N updated digital count values in response to each active transition of the reference clock signal as follows:

maintaining the count value at its current state if the reference speed signal and the fan speed signal have the same logic state for that active clock transition;

incrementing the count value by one binary value if the reference speed signal is at an active logic state and the fan speed signal is at an inactive logic state for that active clock transition; and decrementing the count value by one binary value if the fan speed signal is at an active logic state and the reference speed signal is at an inactive logic state for that active clock transition; and converting the N digital count values to N analog voltage levels representative of the integral difference between the reference frequency and each of the N corresponding fan frequencies.

20. The method of claim 19 wherein the least significant bit of each digital count value represents phase difference information indicative of a difference between the reference phase and the corresponding fan phase, and the controlling step further includes:

filtering the least significant bit of the N digital count values to generate N analog voltages, each representative of a duty cycle of active states of the least significant bit of the corresponding digital count value.

21. The method of claim 14 wherein the controlling step includes the step of:

controlling power supplied to the corresponding fan motors with pulse width modulation.

22. The method of claim 14 wherein the controlling step includes the steps of:

measuring a difference between the reference phase and each corresponding fan phase to provide N phase difference signals;

measuring an instantaneous difference between the reference frequency and each corresponding fan frequency to provide N instantaneous velocity difference signals;

measuring an integral difference between the reference frequency and each fan frequency to provide N integral velocity difference signals; and adding each corresponding phase difference signal, instantaneous velocity difference signal, and integral velocity difference signal to provide N corresponding voltage control signals for controlling the variable rotational speed of the fan blades of the corresponding N fans.

23. The method of claim 22 wherein the controlling step further includes the step of:

controlling power supplied to the corresponding fan motor with pulse width modulation controlled by the voltage control signal.

24. The method of claim 14 wherein the controlling step includes the steps of:

controlling the variable rotational speeds with phase locked loop (PLL) controllers; and detecting whether each PLL controller is in lock.

25. The method of claim 24 wherein the detecting step provides an indication of a fan failure when the detecting step fails to detect a lock condition for a selected time interval.

* * * * *